US012637768B2

(12) United States Patent
Zhang et al.

(10) Patent No.: US 12,637,768 B2
(45) Date of Patent: May 26, 2026

(54) SELECTIVE DEPOSITION OF MATERIAL COMPRISING NOBLE METAL

(71) Applicant: ASM IP Holding B.V., Almere (NL)

(72) Inventors: Chao Zhang, Helsinki (FI); Mikko Ritala, Espoo (FI); Eva Tois, Espoo (FI)

(73) Assignee: ASM IP Holding B.V., Almere (NL)

( * ) Notice: Subject to any disclaimer, the term of this patent is extended or adjusted under 35 U.S.C. 154(b) by 469 days.

(21) Appl. No.: 18/209,519

(22) Filed: Jun. 14, 2023

(65) Prior Publication Data

US 2023/0407476 A1      Dec. 21, 2023

Related U.S. Application Data

(60) Provisional application No. 63/353,030, filed on Jun. 17, 2022.

(51) Int. Cl.
*C23C 16/455* (2006.01)
*C23C 16/18* (2006.01)
*H10P 14/40* (2026.01)

(52) U.S. Cl.
CPC ........ *C23C 16/45553* (2013.01); *C23C 16/18* (2013.01); *H10P 14/418* (2026.01)

(58) Field of Classification Search
CPC ......... H01L 21/28568; H01L 21/28562; C23C 16/04; C23C 16/18; C23C 16/45534; C23C 16/45523
See application file for complete search history.

(56) References Cited

U.S. PATENT DOCUMENTS

| | | | | |
|---|---|---|---|---|
| 2005/0186341 A1* | 8/2005 | Hendrix | .................. | C23C 16/16 |
| | | | | 427/248.1 |
| 2006/0121733 A1* | 6/2006 | Kilpela | ................... | C23C 16/18 |
| | | | | 257/E21.171 |
| 2008/0096381 A1* | 4/2008 | Han | ........................ | C23C 16/18 |
| | | | | 257/E21.171 |
| 2008/0268635 A1* | 10/2008 | Yu | ........................... | C23C 16/18 |
| | | | | 438/655 |
| 2009/0087982 A1* | 4/2009 | Wang | ................ | H01L 21/76843 |
| | | | | 438/653 |
| 2012/0052681 A1* | 3/2012 | Marsh | ................. | C23C 16/0227 |
| | | | | 438/763 |
| 2020/0131633 A1* | 4/2020 | Chung | .............. | C23C 16/45553 |
| 2021/0225644 A1* | 7/2021 | Ouyang | ........... | H01L 21/76862 |

* cited by examiner

*Primary Examiner* — Joseph A Miller, Jr.
(74) *Attorney, Agent, or Firm* — Mark W. Scott; Laine IP Oy

(57) ABSTRACT

The current disclosure relates to methods and apparatuses for the manufacture of semiconductor devices. In the disclosure, a material comprising noble metal is selectively deposited on a substrate by a cyclic deposition process. The deposition method comprises providing a substrate in a reaction chamber, wherein the substrate comprises a first surface comprising a first material, and a second surface comprising a second material. A noble metal precursor comprising a noble metal β-diketonate compound is provided in the reaction chamber in vapor phase and a reactant is provided in the reaction chamber in vapor phase to deposit a material comprising noble metal on the first surface relative to the second surface.

12 Claims, 4 Drawing Sheets

SELECTIVE DEPOSITION OF MATERIAL COMPRISING NOBLE METAL

CROSS-REFERENCE TO RELATED APPLICATIONS

This application claims the benefit of U.S. Provisional Application No. 63/353,030, filed Jun. 17, 2022, which is incorporated by reference herein in its entirety.

FIELD

The present disclosure relates to methods and apparatuses for selectively depositing a material comprising noble metal on a surface of a substrate, to layers and structures including the material comprising noble metal, and to vapor deposition apparatuses for depositing the material comprising noble metal. The methods and apparatuses may find use, for example in the manufacture of semiconductor devices.

BACKGROUND

Advances in semiconductor manufacturing present a need for new processing approaches. Conventionally, patterning in semiconductor processing involves subtractive processes, in which blanket layers are deposited, masked by photolithographic techniques, and etched through openings in the mask. Additive patterning is also known, in which masking steps precede deposition of the materials of interest, such as patterning using lift-off techniques or damascene processing. In most cases, expensive multi-step lithographic techniques are applied for patterning.

While extreme ultraviolet (EUV) lithography and multi-patterning techniques may enable future scaling, pattern misalignment, such as edge placement error (EPE), may become a bottleneck in integrated circuit (IC) fabrication at advanced technology nodes. To mitigate this challenge, self-aligned thin-film patterning has received extensive research interest.

Area-selective atomic layer deposition (AS-ALD) is a self-aligned vapor deposition process that exploits local chemical differences on a substrate surface to direct material growth on desired substrate areas while no growth occurs on the others. The chemical differences on a substrate surface either already exist, for example, on IC devices (semiconductors, insulators, metals) or are specifically created. AS-ALD presents an alternative for patterning, and it has gained increasing interest among semiconductor manufacturers. AS-ALD can be highly beneficial in various ways. Significantly, it could allow a decrease in lithography steps, reducing the cost of processing. One of the challenges with selective deposition is that selectivity for deposition processes are often not high enough to accomplish the goals of selectivity. Surface pretreatment is sometimes available to either inhibit or encourage deposition on a given surface, but often such treatments themselves call for lithography to have the treatments applied or remain only on the surface to be treated.

Thus, there is need in the art for more versatile, and especially simple, selective deposition schemes to deposit different materials on various surface material combinations for semiconductor structures.

Any discussion, including discussion of problems and solutions, set forth in this section has been included in this disclosure solely for the purpose of providing a context for the present disclosure. Such discussion should not be taken as an admission that any or all of the information was known at the time the invention was made or otherwise constitutes prior art.

SUMMARY

This summary may introduce a selection of concepts in a simplified form, which may be described in further detail below. This summary is not intended to necessarily identify key features or essential features of the claimed subject matter, nor is it intended to be used to limit the scope of the claimed subject matter.

In one aspect, a method of selectively depositing material comprising noble metal on a substrate by a cyclic deposition process is disclosed. The method comprises providing a substrate in a reaction chamber, wherein the substrate comprises a first surface comprising a first material, and a second surface comprising a second material. The method further comprises providing a noble metal precursor comprising a noble metal β-diketonate compound in the reaction chamber in vapor phase, and providing a reactant in the reaction chamber in vapor phase to deposit a material comprising noble metal on the first surface.

In some embodiments, the β-diketonate ligand of the noble metal β-diketonate compound is selected from a group consisting of acac, hfac, thd and fod. In some embodiments, the noble metal of the noble metal β-diketonate compound is selected from Ag, Ru, Rh, Pd, Ir, Pt and Au. In some embodiments, the noble metal of the noble metal β-diketonate compound is selected from Ag, Ru, Rh, Pd, Ir and Pt. In some embodiments, the noble metal β-diketonate compound is selected from the group consisting of $Ru(thd)_3$, $Rh(acac)_3$, $Pd(hfac)_2$, $Pd(thd)_2$, $Ag(fod)(PEt_3)$, $Ag(hfac)(cod)$, $Ag(hfac)(PMe_3)$, $Ir(acac)_3$, and $Pt(acac)_2$. In the current disclosure, thd stands for 2,2,6,6-tetramethylheptane-3,5-dionato, acac for acetylacetonato (pentane-2,4-dionate), hfac for hexafluoroacetylacetonato (1,1,1,5,5,5-hexanfluoropentane-2,4-dionato), fod for 2,2-dimethyl-6,6,7,7,8,8,8-heptafluorooctane-3,5-dionato, cod for 1,5-cyclooctadiene, $PEt_3$ for triethylphosphino and $PMe_3$ for trimethylphosphino.

In some embodiments, the first surface comprises a dielectric material. In some embodiments, the first surface consists essentially of, or consists of, a dielectric material. In some embodiments, the dielectric material of the first surface is low k material. In some embodiments, the dielectric material of the first surface comprises silicon. In some embodiments, the dielectric material of the first surface comprises silicon and oxygen. In some embodiments, the dielectric material of the first surface comprises silicon, oxygen and carbon. In some embodiments, the dielectric material of the first surface comprises silicon, oxygen and nitrogen. In some embodiments, the dielectric material of the first surface comprises silicon, oxygen, carbon and nitrogen. In some embodiments, the dielectric material of the first surface comprises a material selected from a group consisting of $SiO_2$, SiOC, SiON and SiOCN. In some embodiments, the material of the first surface comprises a material selected from $SiO_2$ and SiOC.

In some embodiments, the first surface comprises a metal. In some embodiments, the first surface comprises elemental metal. In some embodiments, the first surface comprises a noble metal.

In some embodiments, the second surface comprises a metal. In some embodiments, the second surface consists essentially of, or consists of dielectric material. In some embodiments, the dielectric material of the second surface is an oxide. In some embodiments, the dielectric material of the second surface is a high k material. In some embodiments, the dielectric material of the second surface is selected from aluminum oxide, tantalum oxide, hafnium oxide, zirconium oxide, hafnium zirconate, titanium oxide, yttrium oxide, lanthanum oxide, scandium oxide, strontium titanate, barium titanate, barium strontium titanate and magnesium oxide. $Al_2O_3$, $Ta_2O_5$, $HfO_2$, $ZrO_2$, $TiO_2$, $Y_2O_3$, $La_2O_3$, $ScO_2$, $SrTiO$, $BaTiO$, $BaSrTiO$, $MgO$, $Er_2O_3$, $Nb_2O_5$ or a combination thereof. In some embodiments, the metal of the second surface comprises elemental metal. In some embodiments, the metal of the second surface comprising elemental metal is selected from row 4 transition metals. In some embodiments, the metal of the second surface comprising elemental metal is selected from late row 4 transition metals. In some embodiments, the metal of the second surface comprising elemental metal is selected from group 3 to group 6 transition metals. In some embodiments, the metal of the second surface comprising elemental metal is selected from Sc, Y, Ti, Zr, Hf, V, Nb, Ta, Cr, Mo, W, Mn, Fe, Co, Ni, Cu, Zn, Al, Ga and In. In some embodiments, the metal of the second surface comprises elemental transition metal having surface oxidation.

In some embodiments, the reactant comprises an oxygen reactant. In some embodiments, the oxygen reactant is selected from a group consisting of molecular oxygen ($O_2$), water ($H_2O$), hydrogen peroxide ($H_2O_2$) and combinations thereof. In some embodiments, the reactant comprises molecular hydrogen ($H_2$).

In some embodiments, the noble metal is deposited substantially as elemental noble metal. In some embodiments, a substantially continuous noble metal layer having a thickness of at least 10 nm is deposited on a first surface with substantially no deposition on the second surface.

In some embodiments, the selectivity of the method is at least 80%. In some embodiments, the noble metal precursor and the reactant are provided in the reaction chamber alternately and sequentially.

In some embodiments, the method comprises cleaning the substrate before providing the noble metal precursor in the reaction chamber. In some embodiments, cleaning the substrate comprises contacting the substrate with a cleaning agent. In some embodiments, the cleaning agent comprises a chemical selected from β-diketonates, cyclopentadienyl-containing chemicals, carbonyl-containing chemicals, carboxylic acids and hydrogen.

In some embodiments, the method comprises activating the substrate before providing the noble metal precursor in the reaction chamber. In some embodiments, activating the substrate comprises exposing the substrate to UV radiation.

In some embodiments, the reaction chamber is purged after providing a noble metal precursor and/or reactant in the reaction chamber.

In some embodiments, the method is a thermal deposition method. In some embodiments, the material comprising noble metal or noble metal layer is formed at a temperature from about 200° C. to about 375° C.

In a second aspect, a device structure including the material comprising noble metal formed according to the method disclosed herein is disclosed.

In a third aspect, a vapor deposition assembly for depositing a noble metal-containing material on a substrate is disclosed. The vapor deposition assembly comprises one or more reaction chambers constructed and arranged to hold a substrate comprising a first surface and a second surface, the first surface comprising a first material and the second surface comprising a second material, a precursor injector system constructed and arranged to provide a noble metal precursor and a reactant in the reaction chamber, a noble metal precursor source vessel constructed and arranged to hold a noble metal precursor in fluid communication with the reaction chamber, and a reactant source vessel constructed and arranged to hold a reactant in fluid communication with the reaction chamber, wherein the noble metal precursor comprises a noble metal β-diketonate compound.

In this disclosure, any two numbers of a variable can constitute a workable range of the variable, and any ranges indicated may include or exclude the endpoints. Additionally, any values of variables indicated (regardless of whether they are indicated with "about" or not) may refer to precise values or approximate values and include equivalents, and may refer to average, median, representative, majority, or the like. Further, in this disclosure, the terms "including," "constituted by" and "having" refer independently to "typically or broadly comprising," "comprising," "consisting essentially of," or "consisting of" in some embodiments. In this disclosure, any defined meanings do not necessarily exclude ordinary and customary meanings in some embodiments.

BRIEF DESCRIPTION OF DRAWINGS

The accompanying drawings, which are included to provide a further understanding of the disclosure and constitute a part of this specification, illustrate exemplary embodiments, and together with the description help to explain the principles of the disclosure. In the drawings

DETAILED DESCRIPTION

Figure 1:
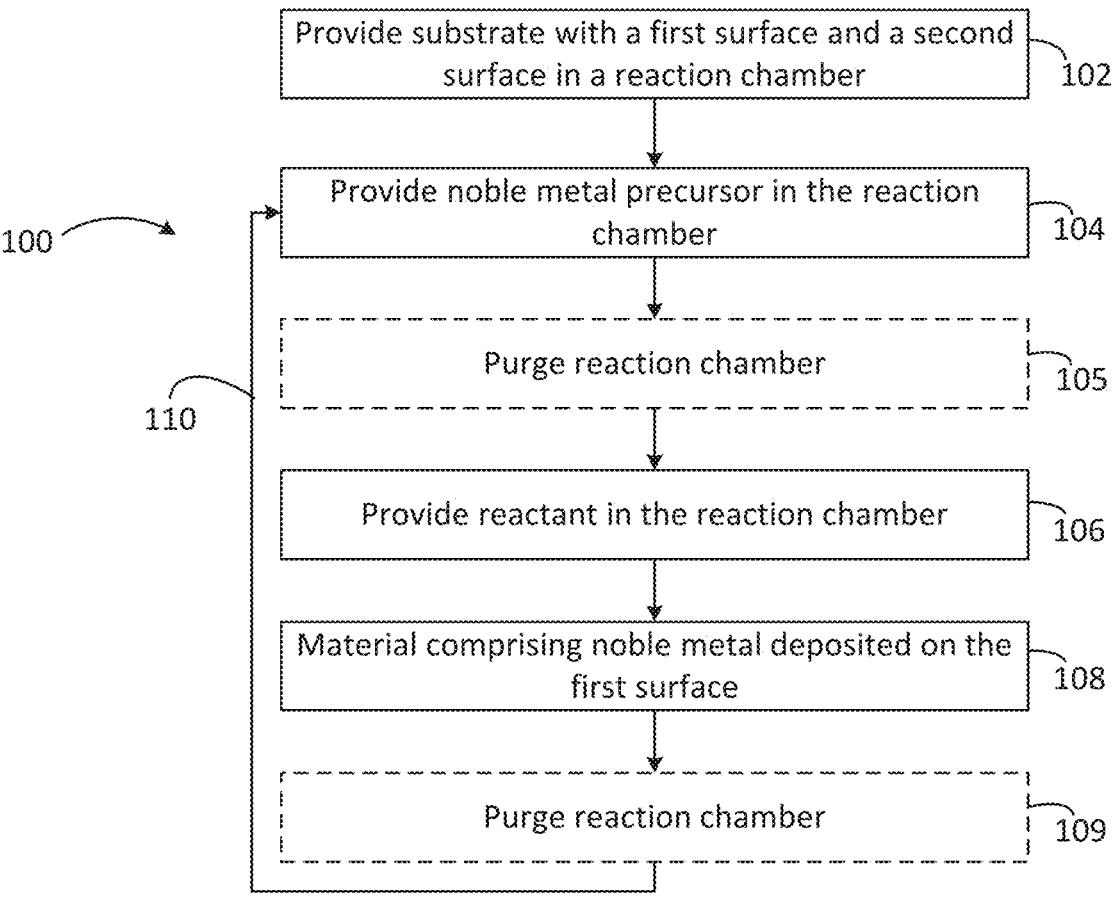
FIG. 1 presents a flow chart of an exemplary embodiment of a method according to the current disclosure.

The description of exemplary embodiments of methods, structures, devices and apparatuses provided below is merely exemplary and is intended for purposes of illustration only. The following description is not intended to limit the scope of the disclosure or the claims. Moreover, recitation of multiple embodiments having indicated features is not intended to exclude other embodiments having additional features or other embodiments incorporating different combinations of the stated features. For example, various embodiments are set forth as exemplary embodiments and may be recited in the dependent claims. Unless otherwise noted, the exemplary embodiments or components thereof may be combined or may be applied separate from each other.

The illustrations presented herein are not meant to be actual views of any particular material, structure, or device, but are merely idealized representations that are used to describe embodiments of the disclosure.

In one aspect, a method of selectively depositing material comprising noble metal on a substrate by a cyclic deposition process is disclosed. In various methods according to the current disclosure, a substrate is provided in a reaction chamber. In other words, a substrate is brought into space where the deposition conditions can be controlled. The reaction chamber may be part of a cluster tool in which different processes are performed to form an integrated circuit. In some embodiments, the reaction chamber may be a flow-type reactor, such as a cross-flow reactor. In some embodiments, the reaction chamber may be a showerhead reactor. In some embodiments, the reaction chamber may be a space-divided reactor. In some embodiments, the reaction chamber may be single wafer ALD reactor. In some embodiments, the reaction chamber may be a high-volume manufacturing single wafer ALD reactor. In some embodiments, the reaction chamber may be a batch reactor for manufacturing multiple substrates simultaneously. In some embodiments, the reaction chamber is a multi-station reaction chamber.

Substrate

As used herein, the term substrate may refer to any underlying material or materials that may be used to form, or upon which, a device, a circuit, material or a material layer may be formed. A substrate can include a bulk material, such as silicon (such as single-crystal silicon), other Group IV materials, such as germanium, or other semiconductor materials, such as a Group II-VI or Group Ill-V semiconductor materials. A substrate can include one or more layers overlying the bulk material. The substrate can include various topologies, such as gaps, including recesses, lines, trenches or spaces between elevated portions, such as fins, and the like formed within or on at least a portion of a layer of the substrate. Substrate may include nitrides, for example TiN, oxides, insulating materials, dielectric materials, conductive materials, metals, such as such as tungsten, ruthenium, molybdenum, one or more transition metals, aluminum or copper, or metallic materials, crystalline materials, epitaxial, heteroepitaxial, and/or single crystal materials. In some embodiments of the current disclosure, the substrate comprises silicon. The substrate may comprise other materials, as described above, in addition to silicon. The other materials may form layers.

The substrate according to the current disclosure comprises two surfaces, i.e. a first surface comprising a first material and a second surface comprising a second material. The material comprising noble metal and the noble metal layer according to the current disclosure are deposited on the first surface relative to the second surface. The substrate may comprise any number of additional surfaces. The first surface and the second surface may be arranged as any suitable pattern. For example, the first surface and the second surface can be alternating lines or one surface can surround the other surface in a plan view. The first and section surfaces can be coplanar, the first surface may be raised relative to the second surface, or the second surface can be raised relative to the first surface. The first and second surfaces may be formed using one or more reaction chambers.

The first surface and the second surface comprise a first material and a second material, respectively. Thus, they may have different material properties. In some embodiments the first surface and the second surface are adjacent to each other. The first surface and the second surface may be on the same level or one of the surfaces may be lower than the other. In some embodiments, the first surface is lower than the second surface. For example, in some embodiments, the first surface may be etched to be positioned lower than the second surface. In some embodiments, the second surface may be etched to be positioned lower than the first surface. Alternatively or in addition, the materials of the first surface and the second surface may be deposited as to position the first surface and the second surface on different levels.

The substrate may comprise additional material or surfaces in addition to the first surface and the second surface. The additional material may be positioned between the first surface and the substrate, or between the second surface and the substrate, or between both the first and the second surface and the substrate. The additional material may form additional surfaces on the substrate.

First Surface

In some embodiments, the first surface comprises a dielectric material. In some embodiments, the first surface consists essentially of, or consists of, a dielectric material. In some embodiments, the dielectric material of the first surface is low k material. In some embodiments, the dielectric material of the first surface comprises silicon. In some embodiments, the dielectric material of the first surface comprises silicon and oxygen. The first surface may comprise, consist essentially of, or consist of silicon oxide.

In some embodiments, the first surface comprises silicon, oxygen and carbon. For example, the first surface may comprise, consist essentially of, or consist of SiOC. In some embodiments, the first surface does not comprise SiOC. Without limiting the current disclosure to any specific theory, in embodiments in which the first surface comprises carbon, the substrate may be activated by, for example, UV radiation. Thus, in some embodiments, the dielectric material of the first surface comprises a material selected from a group consisting of $SiO_2$, SiOC, SiON and SiOCN. In some embodiments, the first surface does not comprise $SiO_2$. In some embodiments, the first surface does not comprise SiON. In some embodiments, the first surface does not comprise SiOCN. In some embodiments, the first surface comprises silicon and nitrogen. In some embodiments, the first surface comprises, consists essentially of, or consists of silicon nitride. For example, the first surface may comprise $Si_3N_4$. In some embodiments, the first surface does not comprise silicon nitride. In some embodiments, the first surface comprises germanium (Ge). In some embodiments, the first surface comprises germanium oxide, such as $GeO_2$. In some embodiments, the first surface comprises Ge and N, or the first surface comprises Ge, N and O. In some embodiments, the first surface comprises, consists essentially of, or consists of silicon and germanium. In some embodiments, the first surface comprises SiGe. In some embodiments, the first surface comprises amorphous silicon.

In some embodiments, the first surface comprises a metal. In some embodiments, the first surface consists essentially of, or consists of, a metal. Thus, in some embodiments, the first surface is a metal or metallic surface. In some embodiments, the first surface comprises, consists essentially of, or consists of, a transition metal. In some embodiments, the first surface comprises elemental metal or metal alloy. In some embodiments, the first surface comprises electrically conductive material. In some embodiments, the first surface consists essentially of, or consist of conductive material. By a conductive material is herein meant material that has electrical conductivity comparable to materials that are generally held to be conductive in the art of semiconductor device manufacture. In some embodiments, resistivity of a conductive material may vary from about 2 μOhm cm to about 5 mOhm cm.

In some embodiments, the first surface comprises, consists essentially of, or consists of, a metal selected from a group consisting of Ti, Ru, Pt and Co. In some embodiments, the first surface comprises, consists essentially of, or consists of titanium (Ti). In some embodiments, the first surface comprises, consists essentially of, or consists of cobalt (Co). In some embodiments, the first surface comprises aluminum (Al), such as aluminum oxide (e.g. Al₂O₃). Without limiting the current disclosure to any specific theory, however, the deposition of a material comprising a noble metal on aluminum oxide surface according to the current disclosure may be dependent on the presence of precursor residues on the aluminum oxide surface, or other secondary factors affecting the initiation of deposition thereon. In some embodiments, the first surface may comprise, consist essentially of, or consist of, a metal oxide, such as aluminum oxide. In some embodiments, the first surface comprises in situ-grown metal oxide, such as aluminum oxide. In some embodiments, the first surface consists essentially of, or consists of in situ-grown metal oxide, such as aluminum oxide. By an in situ-grown metal oxide is herein meant metal oxide that has not been exposed to ambient atmosphere before selective deposition according to the current disclosure. In some embodiments, by in situ-grown metal oxide is meant metal oxide that has been grown in the same cluster tool (i.e. vapor deposition assembly) or even in the same chamber in which the selective deposition according to the current disclosure is performed, without removing the substrate from the tool.

In some embodiments, the first surface comprises a noble metal. In some embodiments, the first surface comprises, consists essentially of, or consists of, ruthenium (Ru). In some embodiments, the first surface comprises, consists essentially of, or consists of osmium (Os). In some embodiments, the first surface comprises, consists essentially of, or consists of rhodium (Rh). In some embodiments, the first surface comprises, consists essentially of, or consists of iridium (Ir). In some embodiments, the first surface comprises, consists essentially of, or consists of palladium (Pd). In some embodiments, the first surface comprises, consists essentially of, or consists of platinum (Pt). Thus, in some embodiments, the first surface comprises, consists essentially of, or consists of, at least one noble metal selected from Ru, Os, Rh, Ir, Pd and Pt.

The first surface, whether comprising dielectric material or a metal, may comprise surface oxidation, such as a native oxide layer, or the first surface may be otherwise oxidized. In some embodiments, the metal or metallic material of the first surface is electrically conductive with or without surface oxidation. In some embodiments, the first material, such as a dielectric material, for example silicon-comprising material, or a metal, such as a transition metal, may be doped with one or more additional elements. The doping element may comprise a metal, semimetal or a non-metal to amend the material properties. For example, the first surface may comprise, consist essentially, or consist of doped silicon oxide, such as boron-doped silicon oxide or phosphorus-doped silicon oxide. A dopant may be a metal, such as tin, a semimetal, such as germanium or boron, or a non-metal, such as phosphorus. In some embodiments, a metal surface may be doped with non-metal or semimetal elements to influence its electrical properties. In some embodiments, the first surface comprises a doped metal surface. In some embodiments, the first surface consists essentially of, or consists of doped metal surface. In some embodiments the first surface may be any surface that can accept or coordinate with the first or reactant utilized in a selective deposition process as described herein.

Second Surface

The second surface according to the current disclosure comprises a second material, and is the no-growth surface relative to the first surface. In other words, the material comprising a noble metal is not deposited, or is deposited to a lesser extent, on the second surface relative to the first surface.

In some embodiments, the second surface comprises a metal. In some embodiments, the second surface consists essentially of, or consists of, a metal. Thus, in some embodiments, the second surface is a metal or metallic surface. In some embodiments, the second surface comprises elemental metal or metal alloy. In some embodiments, the second surface comprises electrically conductive material. In some embodiments, the second surface consists essentially of, or consist of conductive material. In some embodiments, the second surface comprises an elemental metal selected from late row 4 transition metals. In some embodiments, the metal of the second surface comprising elemental metal is selected from Sc, Y, Ti, Zr, Hf, V, Nb, Ta, Cr, Mo, W, Mn, Fe, Co, Ni, Cu, Zn, Al, Ga and In. In some embodiments, the second surface comprises, consists essentially of, or consists of copper (Cu). In some embodiments, the second surface comprises, consists essentially of, or consists of nickel (Ni). In some embodiments, the second surface comprises, consists essentially of, or consists of cobalt (Co). In some embodiments, the second surface comprises, consists essentially of, or consists of zinc (Zn). In some embodiments, the second surface comprises, consists essentially of, or consists of tungsten (W). In some embodiments, the second surface comprises, consists essentially of, or consists of yttrium (Y). In some embodiments, the second surface comprises, consists essentially of, or consists of scandium (Sc). In some embodiments, the second surface comprises, consists essentially of, or consists of titanium (Ti). In some embodiments, the second surface comprises, consists essentially of, or consists of Zr. In some embodiments, the second surface comprises, consists essentially of, or consists of Hf. In some embodiments, the second surface comprises, consists essentially of, or consists of vanadium (V). In some embodiments, the second surface comprises, consists essentially of, or consists of niobium (Nb). In some embodiments, the second surface comprises, consists essentially of, or consists of tantalum (Ta). In some embodiments, the second surface comprises, consists essentially of, or consists of chromium (Cr). In some embodiments, the second surface comprises, consists essentially of, or consists of molybdenum (Mo). In some embodiments, the second surface comprises, consists essentially of, or consists of manganese (Mn). In some embodiments, the second surface comprises, consists essentially of, or consists of iron (Fe). In some embodiments, the second surface comprises, consists essentially of, or consists of aluminum (Al). In some embodiments, the second surface comprises, consists essentially of, or consists of gallium (Ga). In some embodiments, the second surface comprises, consists essentially of, or consists of indium (In). In some embodiments, the metal of the second surface comprises elemental metal. In some embodiments, the second surface comprises a row 4 transition metal. In some embodiments, the second surface comprises a group 4 to 6 transition metal. In some embodiments, the second surface does not comprise Sc. In some embodiments, the second surface does not comprise Y. In some embodiments, the second surface does not comprise Ti. In some embodiments, the second surface does not comprise Zr. In some embodiments, the second surface does not comprise Hf. In some embodiments, the second surface does not comprise V. In some embodiments, the second surface does not comprise Nb. In some embodiments, the second surface does not comprise Ta. In some embodiments, the second surface does not comprise Cr. In some embodiments, the second surface does not comprise Mo. In some embodiments, the second surface does not comprise W. In some embodiments, the second surface does not comprise Mn. In some embodiments, the second surface does not comprise Fe. In some embodiments, the second surface does not comprise Co. In some embodiments, the second surface does not comprise Ni. In some embodiments, the second surface does not comprise Cu. In some embodiments, the second surface does not comprise Zn. In some embodiments, the second surface does not comprise Al. In some embodiments, the second surface does not comprise Ga. In some embodiments, the second surface does not comprise In. In some embodiments, the second surface does not comprise a row 4 transition metal. In some embodiments, the second surface does not comprise a group 4 to 6 transition metal. In some embodiments, the second surface consists essentially of, or consists of, elemental metal or an alloy of elemental metals. An elemental metal surface may comprise surface oxidation.

The second surface may comprise, consist essentially of, or consist of, a dielectric material. Examples of possible dielectric materials include metal oxide-based materials. In some embodiments the dielectric material comprises a metal oxide. In some embodiments, the dielectric material of the second surface is a high k material. In some embodiments, the dielectric material of the second surface is selected from aluminum oxide, tantalum oxide, hafnium oxide, zirconium oxide, hafnium zirconate, titanium oxide, yttrium oxide, lanthanum oxide, scandium oxide, strontium titanate, barium titanate, barium strontium titanate and magnesium oxide, erbium oxide, niobium oxide or a combination thereof. In the current disclosure, aluminum oxide may be, for example, $Al_2O_3$, tantalum oxide $Ta_2O_5$, hafnium oxide $HfO_2$, zirconium oxide $ZrO_2$, hafnium zirconate $HfZrO_4$, or $Hf_{1-x}Zr_xO_2$, titanium oxide $TiO_2$, yttrium oxide $Y_2O_3$, lanthanum oxide $La_2O_3$, scandium oxide $ScO_2$, strontium titanate $SrTiO_3$, barium titanate $BaTiO_3$, barium strontium titanate $Ba_{0.5}Sr_{0.5}TiO_3$, or $Ba_xSr_{1-x}TiO_3$, magnesium oxide $MgO$, erbium oxide $Er_2O_3$ and niobium oxide $Nb_2O_5$. In some embodiments, the second surface may comprise ferroelectric material, such as $HfZrO_2$ (in various proportions of Hf and Zr). In some embodiments, the second material comprises non-ferroelectric hafnium zirconate. The dielectric material of the second surface, such as a metal oxide, may comprise doped material. The dopant may be suitable material, such as H, Si, Hf, Ti, Zr, or Nb.

In some embodiments, the dielectric material is a low k material, such as SiOC. In some embodiments, the second surface comprises SiOC. Without limiting the current disclosure to any specific theory, material referred to as SiOC mayor may not comprise carbide bonds. The term SiOC is to be understood as material comprising silicon, oxygen and carbon. SiOC comprised in the second surface may comprise methyl groups. In some embodiments, the second surface comprises silicon-containing material comprising silicon-carbon bonds. In some embodiments, the second surface comprises silicon-containing material comprising methyl groups. In some embodiments, the second surface comprises silicon-containing material comprising methyl groups and oxygen.

Combinations of First Surface and Second Surface

In some embodiments, the first surface is an activated, such as UV-treated, low k surface, e.g. SiOC, and the second surface is a Cu surface. In some embodiments, the first surface is a silicon oxide surface, and the second surface is a metal surface, such as Cu or Co surface. In some embodiments, the first surface is a silicon and oxygen comprising surface, such as a silicon oxide or activated SiOC surface, and the second surface is a metal oxide surface, such as $HfO_2$ surface, $Ta_2O_5$ surface, $TiO_2$ surface, $Y_2O_3$ surface, $ZrO_2$ surface, $HfZrO_2$ surface or $Al_2O_3$ surface.

In some embodiments, the first surface is a silicon oxide surface, and the second surface is SiOC surface, and the substrate has not been activated, leading to selective deposition on the silicon oxide surface. However, in some embodiments, the substrate may comprise a further surface, such as a metal surface (e.g. Cu) or a metal oxide surface (such as $HfO_2$, $Al_2O_3$), in which case, after activation, both silicon-containing surfaces may form a first surface, whereas the metal oxide surface(s) may form a second surface. Activation according to the current disclosure is to be understood as a process whereby the surface is modified to be receptive for deposition. Activation may, for example, mean removal of methyl groups through UV treatment.

Selectivity

By appropriately selecting the deposition conditions, material comprising noble metal may be selectively deposited on the first surface relative to the second surface. The methods according to the current disclosure may be performed without pre-treatments, such as passivation or other surface treatments to bring about selectivity. Thus, in some embodiments of the methods presented in the current disclosure, the deposition is inherently selective. However, as is understood by the skilled person, selectivity may be improved by processes such as cleaning of substrate surface, selective etching or the like.

Selectivity can be given as a percentage calculated by [(deposition on first surface)–(deposition on second surface)]/(deposition on the first surface). Deposition can be measured in any of a variety of ways. In some embodiments, deposition may be given as the measured thickness of the deposited material. In some embodiments, deposition may be given as the measured amount of material deposited.

In some embodiments, selectivity is at least about 30%, at least about 50%, at least about 75%, at least about 80%, at least about 90%, at least about 93%, at least about 95%, at least about 98%, at least about 99% or at least about 99.5%. In some embodiments, the selectivity can change over the duration or thickness of a deposition.

In some embodiments, deposition substantially only, or only, occurs on the first surface and not on the second surface. In some embodiments, deposition on the first surface of the substrate relative to the second surface of the substrate is at least about 80% selective, which may be selective enough for some particular applications. In some embodiments the deposition on the first surface of the substrate relative to the second surface of the substrate is at least about 50% selective, which may be selective enough for some particular applications. In some embodiments the deposition on the first surface of the substrate relative to the second surface of the substrate is at least about 30% selective, which may be selective enough for some particular applications.

In some embodiments the material comprising noble metal deposited on the first surface of the substrate may have a thickness of more than about 50 nm, more than about 20 nm, more than about 10 nm, more than about 5 nm, more than about 3 nm, more than about 2 nm, or more than about 1 nm, while there is substantially no deposition on the second surface. In some embodiments, minor, island-like, deposition may be detectable on the second surface, while a continuous material layer is deposited on the first surface. In some embodiments, a ratio of material comprising noble metal deposited on the first surface of the substrate relative to the second surface of the substrate may be greater than or equal to about 2:1, greater than or equal to about 20:1, greater than or equal to about 200:1, For example, ratio of material comprising noble metal deposited on the first surface of the substrate relative to the second surface of the substrate may be about 150:1, about 100:1, about 50:1, about 20:1, about 15:1, about 10:1, about 5:1, about 3:1, or about 2:1.

In some embodiments, a substantially continuous noble metal layer having a thickness of at least 10 nm is deposited on a first surface with substantially no deposition on the second surface. In some embodiments, a substantially continuous noble metal layer having a thickness of at least 15 nm is deposited on a first surface with substantially no deposition on the second surface. In some embodiments, a substantially continuous noble metal layer having a thickness of at least 20 nm is deposited on a first surface with substantially no deposition on the second surface. In some embodiments, a substantially continuous noble metal layer having a thickness of at least 25 nm is deposited on a first surface with substantially no deposition on the second surface.

In some embodiments, selectivity of the selective deposition processes described herein may depend on the materials which comprise the first and/or second surface. For example, in some embodiments, where the first surface comprises silicon oxide and the second surface comprises a metal, such as Cu or Co, the selectivity may be greater than about 10:1 or greater than about 20:1.

Vapor Deposition

A material comprising noble metal is deposited using a cyclic deposition process. Thus, the method comprises providing a noble metal precursor comprising a noble metal (3-diketonate compound in the reaction chamber in vapor phase, and providing a reactant in the reaction chamber in vapor phase to deposit a material comprising noble metal on the first surface relative to the second surface. Providing a noble metal precursor and a reactant in the reaction chamber may constitute a deposition cycle. A deposition cycle may be performed at least once during a deposition process. In some embodiments, a deposition cycle is repeated one or more times. For example, a deposition cycle may be performed from 2 to 2,000 times, such as about 50, about 100, about 500, about 800, about 1,000 or about 1,500 times. A deposition cycle may comprise additional phases, such as purging between precursors, or providing additional precursor(s) or reactant(s) in the reaction chamber. The deposition cycles may be substantially similar, or the process may comprise two or more different types of deposition cycles, such as differing in the length of providing a precursor or a reactant in the reaction chamber, purge time or deposition temperature.

As used herein, the term "cyclic deposition" may refer to the sequential introduction of precursors (reactants) into a reaction chamber to deposit a layer over a substrate, and it includes processing techniques such as atomic layer deposition (ALD) and cyclic chemical vapor position (cyclic CVD). CVD type processes typically involve gas phase reactions between two or more precursors. The precursors may be provided simultaneously to a reaction chamber containing a substrate on which material is to be deposited. The precursors may be provided in partially or completely separated pulses. The substrate and/or reaction chamber can be heated to promote the reaction between the gaseous precursors. In some embodiments, the precursors are provided until a layer having a desired thickness is deposited. In some embodiments, cyclic CVD type processes can be used with multiple cycles to deposit a thin material having a desired thickness. In cyclic CVD-type processes, the precursors may be provided to the reaction chamber in pulses that do not overlap, or that partially or completely overlap.

ALD-type processes are based on controlled, typically self-limiting surface reactions of precursors. Vapor phase reactions are avoided by feeding the precursors alternately and sequentially into the reaction chamber. Vapor phase precursors are separated from each other in the reaction chamber, for example, by removing excess precursors and/or reaction by-products from the reaction chamber between precursor pulses. This may be accomplished with an evacuation step and/or with an inert gas pulse or purge. In some embodiments the substrate is contacted with a purge gas, such as an inert gas. For example, the substrate may be contacted with a purge gas between precursor pulses to remove excess precursor and reaction by-products.

In some embodiments, each reaction is self-limiting and monolayer by monolayer growth is achieved. These may be referred to as "true ALD" reactions. In some such embodiments the noble metal precursor may adsorb on the substrate surface in a self-limiting manner. A reactant may react in turn with the adsorbed noble metal precursor to form material comprising noble metal on the substrate. In some embodiments, up to a monolayer of material comprising noble metal may be formed in in one deposition cycle. In some embodiments, the noble metal precursor and the reactant are provided in the reaction chamber alternately and sequentially. Alternate and sequential supplying of the precursor(s) and reactant(s) allows depositing the material comprising noble metal in ALD mode.

In some embodiments, a deposition process for material comprising noble metal has one or more phases which are not self-limiting. For example, in some embodiments at least one of the precursors may be at least partially decomposed on the substrate surface. Thus, in some embodiments the process may operate in a process condition regime close to CVD conditions or in some cases fully in CVD conditions.

The method according to the current disclosure may also be used in a spatial atomic layer deposition apparatus. In spatial ALD, the precursors are supplied continuously in different physical sections and the substrate is moving between the sections. At least two sections may be provided where, in the presence of a substrate, a half-reaction can take place. If the substrate is present in such a half-reaction section, about a monolayer may form from the first or reactant. Then, the substrate is moved to the second half-reaction zone, where the ALD cycle is completed with the first or reactant to form the target material. Alternatively, the substrate position could be stationary and the gas supplies could be moved, or some combination of the two. To obtain thicker layers, this sequence may be repeated.

Purging means that vapor phase precursors and/or vapor phase byproducts are removed from the substrate surface such as by evacuating the reaction chamber with a vacuum pump and/or by replacing the gas inside a reaction chamber with an inert gas such as argon or nitrogen. In some embodiments, the reaction chamber is purged after providing a noble metal precursor and/or reactant in the reaction chamber. Purging may be performed between two precursor pulses. Typical purging times are from about 0.05 to 20 seconds, and can be about 0.2 and 10, or between about 0.5 and 5 seconds. However, other purge times can be utilized if necessary, such as where highly conformal step coverage over extremely high aspect ratio structures or other structures with complex surface morphology is needed, or where different reactor types may be used, such as a batch reactor.

As described above for ALD, purging may be performed in a temporal or in a spatial mode.

In this disclosure, "gas" can include material that is a gas at normal temperature and pressure (NTP), a vaporized solid and/or a vaporized liquid, and can be constituted by a single gas or a mixture of gases, depending on the context. The term "inert gas" can refer to a gas that does not take part in a chemical reaction to an appreciable extent. Exemplary inert gases include He and Ar and any combination thereof. In some cases, nitrogen and/or hydrogen can be an inert gas. A gas other than the process gas, i.e., a gas introduced without passing through a gas distribution assembly, other gas distribution device, or the like, can be used for, e.g., sealing the reaction space, and can include a seal gas, such as a rare gas.

The term "precursor" can refer to a compound that participates in the chemical reaction that produces another compound, and particularly to a compound that constitutes deposited material. The term "reactant" can be used interchangeably with the term precursor. However, a reactant may be used for chemistries that modify deposited material.

In some embodiments, the method according to the current disclosure is a thermal deposition method. A thermal deposition method is to be understood as a method, in which precursors and reactants are not activated by plasma. However, in some embodiments, the method may comprise one or more plasma activation steps. Such processes may be termed plasma processes, although they may include thermal deposition steps as well.

Deposited Material

In the methods according to the current disclosure, material comprising noble metal is deposited. In some embodiments, the material comprising noble metal consists essentially of, or consists of, one or more noble metals. In some embodiments, the deposited noble metal is selected from a group consisting of ruthenium (Ru), rhodium (Rh), palladium (Pd), silver (Ag), osmium (Os), iridium (Ir), platinum (Pt) and gold (Au). In some embodiments, the deposited noble metal is selected from a group consisting of Ru, Rh, Pd, Ir and Pt. In some embodiments, the deposited noble metal is selected from a group consisting of Ru, Rh, Pd and Ir. In some embodiments, the deposited material comprising a noble metal consists substantially of, or consists of, ruthenium. In some embodiments, the deposited material comprising a noble metal consists substantially of, or consists of, rhodium. In some embodiments, the deposited material comprising a noble metal consists substantially of, or consists of, palladium. In some embodiments, the deposited material comprising a noble metal consists substantially of, or consists of, silver. In some embodiments, the deposited material comprising a noble metal consists substantially of, or consists of, osmium. In some embodiments, the deposited material comprising a noble metal consists substantially of, or consists of, iridium. In some embodiments, the deposited material comprising a noble metal consists substantially of, or consists of, platinum. In some embodiments, the deposited material comprising a noble metal consists substantially of, or consists of, gold. In some embodiments, the noble metal, such as Ru, Rh, Pd, Ag, Os, Ir, Pt or Au is deposited substantially as elemental noble metal.

In some embodiments, material comprising noble metal deposited according to the current disclosure may form a layer. As used herein, the term "layer" and/or "film" can refer to any continuous or non-continuous structure and material, such as material deposited by the methods disclosed herein. For example, layer and/or film can include two-dimensional materials, three-dimensional materials, nanoparticles or even partial or full molecular layers or partial or full atomic layers or clusters of atoms and/or molecules. A film or layer may comprise material or a layer with pinholes, which may be at least partially continuous. A seed layer may be a non-continuous layer serving to increase the rate of nucleation of another material. However, the seed layer may also be substantially or completely continuous. Thus, the material comprising noble metal may form a layer on the first surface of the substrate. In some embodiments, the layer comprising a noble metal may be substantially or fully continuous. In some embodiments, the layer comprising a noble metal is substantially or fully pinhole-free. In some embodiments, the layer comprising a noble metal is substantially pinhole-free at a thickness below about 50 nm. In some embodiments, the layer comprising a noble metal is substantially pinhole-free at a thickness below about 20 nm. In some embodiments, the layer comprising a noble metal is substantially pinhole-free at a thickness below about 10 nm. In some embodiments, the layer comprising a noble metal is substantially pinhole-free at a thickness below about 7 nm. In some embodiments, the layer comprising a noble metal is substantially pinhole-free at a thickness below about 5 nm. In some embodiments, the layer comprising a noble metal consists substantially of, or consists of, one noble metal. In some embodiments, the layer comprising a noble metal consists substantially of, or consists of, two or more noble metals. A material may be considered to consist of a noble metal despite containing an acceptable amount of impurities.

The material comprising noble metal may contain a non-noble metal element. The material comprising noble metal may contain a third or a further non-noble metal element.

In some embodiments, a material and a layer comprising noble metal may comprise, for example, from about 50 to about 99.5 at. % noble metal, or from about 70 to about 99.5 at. % noble metal, or from about 85 to about 99.5 at. % noble metal, or from about 90 to about 99.5 at. % noble metal. A material comprising noble metal deposited by a method according to the current disclosure may comprise, for example about 30 at. %, about 50 at. %, about 70 at. %, about 80 at. %, about 83 at. %, about 85 at. %, about 87 at. %, about 90 at. %, about 95 at. %, about 97 at. % or about 99 at. % noble metal. In some embodiments, the material comprising noble metal deposited according to the current disclosure comprises less than about 3 at. %, or less that about 1 at. % IMPURITY X. In some embodiments, the material comprising noble metal deposited according to the current disclosure comprises less than about 5 at. %, less than about 3 at. %, less that about 1 at. % or less that about 0.5 at. % oxygen. In some embodiments, the material comprising noble metal deposited according to the current disclosure comprises less than about 3 at. %, or less that about 2 at. %, or less that about 1 at. %, or less that about 0.5 at. % carbon. In some embodiments, the noble metal-containing material deposited according to the current disclosure comprises less than about 2.5 at. %, less that about 2 at. %, less that about 1 at. % or less that about 0.1 at. % hydrogen. The nitrogen content of the material deposited according to the current disclosure may be negligible, as the reacting chemistries do not contain nitrogen. In some embodiments, the material comprising noble metal deposited according to the current disclosure contains less than about 6 at. %, or less than about 3 at. %, or less than about 1 at. % of impurities.

Noble Metal Precursors

In some embodiments, material comprising noble metal or a layer comprising a noble metal may be deposited by a cyclic deposition process using a noble metal precursor comprising a noble metal β-diketonate compound. In some embodiments, the noble metal precursor consists substantially of, or consists of the noble metal β-diketonate compound. A noble metal β-diketonate compound comprises a noble metal atom and a β-diketone ligand. In some embodiments, a noble metal β-diketonate compound comprises one β-diketone ligand. In some embodiments, the noble metal β-diketonate compound comprises two β-diketone ligands. In some embodiments, the noble metal β-diketonate compound comprises three β-diketone ligands.

In some embodiments, the β-diketonate ligand of the noble metal β-diketonate compound is selected from a group consisting of acetylacetonato (acac), hexafluoroacetylacetonato (hfac) and 2,2,6,6-tetramethyl-3,5-heptanedionato (thd). In some embodiments, the noble metal of the noble metal β-diketonate compound is selected from Ru, Rh, Pd, Ir, Pt and Ag. In some embodiments, the noble metal β-diketonate compound is an acac-containing compound. In some embodiments, the noble metal β-diketonate compound is a hfac-containing compound. In some embodiments, the noble metal β-diketonate compound is a thd-containing compound. In some embodiments, the noble metal β-diketonate compound is an acac-containing Ru compound. In some embodiments, the noble metal β-diketonate compound is an acac-containing Rh compound. In some embodiments, the noble metal β-diketonate compound is an acac-containing Pd compound. In some embodiments, the noble metal β-diketonate compound is an acac-containing Ir compound. In some embodiments, the noble metal β-diketonate compound is a heteroleptic compound. By a heteroleptic compound is herein meant a compound comprising two different ligands connected to the metal atom. In some embodiments, the heteroleptic compound compln some embodiments, the noble metal β-diketonate compound is selected from a group consisting of Ru(thd)$_3$, Rh(acac)$_3$, Pd(hfac)$_2$, Pd(thd)$_2$, Ag(fod)(PEt$_3$), Ag(hfac)(cod), Ag(hfac)(PMe$_3$), Ir(acac)$_3$, and Pt(acac)$_2$.

When a noble metal precursor is provided in the reaction chamber, it contacts the substrate. The noble metal precursor may be provided in the reaction chamber for a time period of between about 0.01 seconds and about 90 seconds, between about 0.05 second sand about 60 seconds, between about 0.05 seconds and about 45 seconds, between about 0.05 seconds and about 30 seconds, between about 0.05 seconds and about 15 seconds, between about 0.05 seconds and about 10 seconds or between about 0.05 seconds and about 5 seconds. In some embodiments, the noble metal precursor is provided in the reaction chamber for a time period of between about 0.5 seconds and about 5 seconds, between about 1 second and about 5 seconds, between about 1.5 seconds and about 5 seconds, between about 2 seconds and about 5 seconds. For example, the noble metal precursor may be provided in the reaction chamber for about 0.5 seconds, for about 1 second, for about 1.5 seconds, for about 2 seconds or for about 3 seconds. The pulsing time may depend on the flow rate of the precursors and carrier gases into the reaction chamber. The flow rates of process gases may depend on the specifics of the deposition assembly used for performing the current methods, and may thus be adjusted together or separately from the pulse time.

Excess noble metal precursor and reaction byproducts (if any) may be removed from the substrate surface, e.g., by pumping with an inert gas. For example, in some embodiments of the disclosure, the methods may comprise a purge wherein the substrate surface is purged for a time period of less than approximately 2 seconds. Excess noble metal precursor and any reaction byproducts may be removed with the aid of a vacuum, generated by a pumping system, in fluid communication with the reaction chamber. Purging gas is preferably any inert gas, such as, without limitation, argon (Ar), nitrogen (N$_2$), helium (He), or in some instances hydrogen (H$_2$) could be used. A phase is generally considered to immediately follow another phase if a purge (i.e., purging gas pulse) or other precursor, reactant or by-product removal step intervenes.

Reactant

A reactant is used to convert the surface-bound noble metal precursor or the residue thereof into the noble metal in question. Without limiting the current disclosure to any specific theory, the reactant provided into the reaction chamber may remove any ligands from the noble metal atoms, leaving solid noble metal on the first surface of the substrate.

In some embodiments, the reactant comprises an oxygen reactant. In some embodiments, the oxygen reactant is selected from a group consisting of molecular oxygen (O$_2$), water (H$_2$O) and a mixture of molecular oxygen and water. In some embodiments, the reactant comprises molecular hydrogen (H$_2$). In some embodiments, the second reactant comprises a reducing agent. In some embodiments, the reactant comprises a carboxylic acid, such as formic acid. In some embodiments, the reactant comprises an aldehyde, such as formaldehyde.

In some embodiments of the disclosure each deposition cycle comprises two distinct deposition phases. In a first phase of a deposition cycle ("the noble metal phase"), the substrate is contacted with a noble metal precursor by providing a noble metal precursor in a reaction chamber. The noble metal precursor adsorbs onto the first surface of the substrate. The term adsorption is intended to be non-limiting in respect of a specific mode of interaction between the precursor and the substrate. Without limiting the current disclosure to any specific theory of molecular interaction, in some embodiments, the noble metal precursor may chemisorb on the first surface of the substrate.

In a second phase of deposition, the substrate is contacted with a reactant by providing a reactant in the reaction chamber. The reactant may comprise at least one of an oxygen reactant and molecular hydrogen. The reactant may react with noble metal species on a surface of the substrate to form a material comprising noble metal on the substrate, such as, for example, an elemental noble metal.

In some embodiments, exposing, i.e., contacting, the substrate to the reactant comprises pulsing the reactant over the substrate for a time period of between about 0.01 seconds and about 90 seconds, between about 0.05 second sand about 60 seconds, between about 0.05 seconds and about 45 seconds, between about 0.05 seconds and about 30 seconds, between about 0.05 seconds and about 15 seconds, between about 0.05 seconds and about 10 seconds or between about 0.05 seconds and about 5 seconds. In some embodiments, the reactant is provided in the reaction chamber for a time period of between about 0.5 seconds and about 5 seconds, between about 1 second and about 5 seconds, between about 1.5 seconds and about 5 seconds, between about 2 seconds and about 5 seconds. For example, the reactant may be provided in the reaction chamber for about 0.5 seconds, for about 1 second, for about 1.5 seconds, for about 2 seconds or for about 3 seconds. In addition, during the pulsing of the reactant, the flow rate of the reactant may be less than 2000 sccm, or less than 500 sccm, or less than 100 sccm. In addition, during providing the reactant in the reaction chamber, the flow rate of the reactant may range from about 1 to 2000 sccm, from about 5 to 1000 sccm, or from about 10 to about 500 sccm.

Excess reactant and reaction byproducts, if any, may be removed from the substrate surface, for example, by a purging gas pulse and/or vacuum generated by a pumping system. Purging gas is preferably any inert gas, such as, without limitation, argon (Ar), nitrogen ($N_2$), helium (He), or in some instances hydrogen ($H_2$) could be used.

A deposition cycle in which the substrate is alternatively contacted with the noble metal precursor (i.e., comprising the noble metal β diketonate compound) and the reactant by providing the precursors in the reaction chamber, may be repeated one or more times until a desired thickness of a material comprising noble metal is deposited. It should be appreciated that in some embodiments, the order of the contacting of the substrate with the noble metal precursor and the reactant may be such that the substrate is first contacted with the reactant followed by the noble metal precursor. In addition, in some embodiments, the cyclic deposition process may comprise contacting the substrate with the noble metal precursor one or more times prior to contacting the substrate with the reactant one or more times and, similarly, may alternatively comprise contacting the substrate with the reactant one or more times prior to contacting the substrate with the noble metal precursor one or more times.

In addition, some embodiments of the disclosure may comprise non-plasma precursors, e.g., the noble metal precursor and reactants are substantially free of ionized reactive species. In some embodiments, the noble metal precursor and reactants are substantially free of ionized reactive species, excited species or radical species. For example, both the noble metal precursor and the reactant may comprise non-plasma precursors to prevent ionization damage to the underlying substrate and the associated defects thereby created. The use of non-plasma precursors may be especially useful when the underlying substrate contains fragile fabricated, or least partially fabricated, semiconductor device structures, as the high energy plasma species may damage and/or deteriorate device performance characteristics.

Heating

The cyclic deposition processes described herein, utilizing a noble metal precursor comprising a noble metal β-diketonate compound and a reactant to deposit a noble metal containing material, may be performed in an ALD or CVD deposition system with a heated substrate. The deposited material may be considered to form at the substrate temperature. In some embodiments, the material comprising noble metal or noble metal layer is formed at a temperature from about 200° C. to about 375° C. For example, in some embodiments, methods may comprise heating the substrate to temperature of between approximately 200° C. and approximately 390° C., or even heating the substrate to a temperature of between approximately 225° C. and approximately 390° C. The appropriate temperature window for any given cyclic deposition process, such as, for an ALD reaction, will depend upon the surface termination and precursor species involved. Here, the temperature varies depending on the precursors being used and is generally at or below about 450° C. In some embodiments, the deposition temperature is generally at or above about 200° C. for vapor deposition processes, in some embodiments the deposition temperature is between about 225° C. and about 375° C., and in some embodiments the deposition temperature is between about 250° C. and about 375° C. In some embodiments the deposition temperature is below about 400° C., or below about 350° C., or below about 225° C. In some instances the deposition temperature can be below about 300° C., or below about 200° C. In some instances the deposition temperature can be above about 150° C. In some embodiments, the deposition temperature i.e., the temperature of the substrate during deposition is about 225° C., about 250° C., about 300° C.

Growth Rate

In some embodiments, the growth rate of the noble metal containing material is from about 0.01 A/cycle to about 5 A/cycle, or from about 0.01 A/cycle to about 2 A/cycle. In some embodiments the growth rate of the noble metal containing material is higher than about 0.05 A/cycle, higher than about 0.1 A/cycle, higher than about 0.15 A/cycle, higher than about 0.2 A/cycle, higher than about 0.25 A/cycle, or higher than about 0.3 A/cycle. In some embodiments the growth rate of the noble metal containing material is lower than about 3 A/cycle, lower than about 2 A/cycle, lower than about 1 A/cycle, lower than about 0.5 A/cycle, or lower than about 0.2 A/cycle. In some embodiments, the growth rate of the noble metal containing material may be approximately 0.4 A/cycle.

In some embodiments, the method comprises cleaning the substrate before providing the noble metal precursor in the reaction chamber, and/or before providing the reactant in the reaction chamber. In some embodiments, cleaning the substrate comprises contacting the substrate with a cleaning agent. In some embodiments, the cleaning agent comprises a chemical selected from β-diketonates, cyclopentadienyl-containing chemicals, carbonyl-containing chemicals, carboxylic acids and hydrogen. In some embodiments, the substrate surface may be cleaned with plasma, such as hydrogen plasma.

In some embodiments, the method comprises activating the substrate before providing the noble metal precursor in the reaction chamber. In some embodiments, activating the substrate comprises exposing the substrate to UV radiation. For example UV radiation having a wavelength from about 180 to about 300 nm may be used. In some embodiments, the UV radiation has a wavelength of about 254 nm. The duration of an UV-radiation-based activation depends on the intensity of the radiation, and may vary, for example, between about 1 second and about 5 min. In some embodiments, the duration of the UV treatment may be from about 5 seconds to about 5 minutes, or from about 5 seconds to about 1 minute, or from about 5 seconds to about 30 seconds, or from about 1 second to about 10 seconds.

Further Aspects of the Disclosure

In an aspect, a semiconductor device structure comprising material deposited according to the method presented herein is disclosed. As used herein, a "structure" can be or include a substrate as described herein. Structures can include one or more layers overlying the substrate, such as one or more layers formed according to a method according to the current disclosure.

In accordance with yet additional embodiments of the disclosure, a device, structure, or portion thereof can be formed by a method as described herein. In some embodiments, the device can include a substrate, an insulating or dielectric layer, a layer deposited by a method as described herein overlying the insulating or dielectric layer, and optionally an additional metal layer overlying the layer deposited by a method as described herein. Optionally, a further layer, e.g., a metal layer, may be provided between the layer deposited by a method as described herein and the insulating or dielectric layer. in some embodiments, the device can be or form part of, for example, a MOSFET, e.g. a pMOSFET or an nMOSFET.

In some embodiments, the MOSFET device may be a PMOS field effect transistor. Thus, further provided is a PMOS field effect transistor comprising a threshold voltage tuning layer deposited by a method as described herein. Suitably, the threshold voltage shifting layer may be comprised in a gate electrode comprised in the field effect transistor In some embodiments, the MOSFET device may be an NMOS field effect transistor Thus, further provided is an NMOS field effect transistor comprising a threshold voltage tuning layer deposited by a method as described herein Suitably, the threshold voltage shifting layer is comprised in a gate electrode comprised in the field effect transistor In some embodiments, there is provided a gate-all-around field effect transistor It comprises a gate contact comprising a layer formed according to a method as described herein In some embodiments, there is provided a MIM metal electrode comprising a layer deposited by a method as described herein In some embodiments, there is provided VNAND contact comprising a layer deposited by a method as described herein In some embodiments, there is provided a Dynamic random-access memory (DRAM) cell electrode comprising a layer formed by a method or apparatus as described herein.

DRAWINGS

The disclosure is further explained by the following exemplary embodiments depicted in the drawings. The illustrations presented herein are not meant to be actual views of any particular material, layer, structure, or assembly, but are merely schematic representations to describe embodiments of the current disclosure. It will be appreciated that elements in the figures are illustrated for simplicity and clarity and have not necessarily been drawn to scale. For example, the dimensions of some of the elements in the figures may be exaggerated relative to other elements to help improve the understanding of illustrated embodiments of the present disclosure. The structures and devices depicted in the drawings may contain additional elements and details, which may be omitted for clarity.

FIG. 1 presents a flow chart of an exemplary embodiment of a method according to the current disclosure.

The method 100 may begin with a process block 102 which comprises, providing a substrate in a reaction chamber. The substrate may be heated to a deposition temperature. For example, the substrate may comprise one or more partially fabricated semiconductor device structures. The reaction chamber may comprise an atomic layer deposition reaction chamber, and the substrate may be heated to a deposition temperature. The deposition temperature may be, for example, from about 200° C. to about 325° C., such as about 225° C., about 250° C. or about 300° C. In addition, the pressure within the reaction chamber may be controlled. For example, the pressure within the reaction chamber during the cyclic deposition process may be less than about 100 Torr, less than about 50 Torr, less than about 10 Torr, less than about 5 Torr, or less than about 1 Torr.

The method 100 may continue with a process block 104, in which a noble metal precursor is provided in the reaction chamber. When a noble metal precursor is provided in the reaction chamber, the noble metal precursor may come into contact with the substrate for a time period (the pulse time) from about 0.05 seconds to about 60 seconds. In some embodiments, the noble metal compound may contact the substrate for a time period of between about 0.05 seconds and about 10 seconds, or between about 0.1 seconds and about 5 seconds. In addition, during the time for which the noble metal precursor is provided in the reaction chamber (i.e. pulse time), the flow rate of the noble metal precursor may be selected as appropriate, and be for example about or over 2,000 sccm, from about 1,000 sccm to about 2,000 sccm, or from about 500 sccm to about 1,000 sccm, or from about 200 sccm to about 500 sccm, or from about 100 sccm to about 500 sccm, or less than about 100 sccm.

The method 100 may continue with a process block 105 comprising purging the reaction chamber after noble metal precursor has been provided in the reaction chamber 104. In other words, after contacting the substrate with the noble metal precursor at block 104, excess noble metal precursor and any reaction byproducts may be removed from the reaction chamber by a purge process. However, block 105 is optional, and in some embodiments, it is omitted.

The process continues at process block 106, comprising providing a reactant (i.e. contacting the substrate with a reactant) in the reaction chamber. The reactant reacts with the surface-bound noble metal precursor, or a residue thereof, to form metallic noble metal on the substrate surface. In some embodiments of the disclosure, the reactant may contact the substrate for a time period of between about 0.01 seconds and about 60 seconds, or between about 0.05 seconds and about 30 seconds, or between about 0.1 seconds and about 10 seconds. In addition, during the pulsing of the reactant over the substrate (i.e. providing the reactant in the reaction chamber), the flow rate of the reactant may be less than 2000 sccm, or less than 1000 sccm, or less than 500 sccm, or less than 200 sccm, or even less than 100 sccm.

Providing noble metal precursor (block 104) and reactant (block 106) in the reaction chamber, and thereby contacting them with the substrate leads to the deposition of material comprising noble metal on the first surface (block 108). Although depicted as a separate block, the material comprising noble metal may be continuously formed as the reactant is provided in the reaction chamber. The actual rate of deposition and its kinetics may vary according to process specifics. Depending on the specific material being deposited, and the composition of the first surface and the second surface, the degree of selectivity of the process may vary.

At process block 109, the reaction chamber is purged after providing the reactant in the reaction chamber. If the cyclic deposition process is repeated (loop 110), the second purge (109) may be followed by providing the noble metal precursor in the reaction chamber (104). In other words, after contacting the substrate with the reactant (block 106), the excess reactant and any reaction byproducts may be removed from the reaction chamber by a purge 109.

The exemplary cyclic deposition method 100 wherein material comprising noble metal is selectively deposited on the first surface of the substrate relative to the second surface of the substrate by alternatively and sequentially contacting the substrate with the noble metal precursor (process block 104) and the reactant (process block 106) may constitute one deposition cycle. In some embodiments, the method of depositing a noble metal containing material may comprise repeating the deposition cycle one or more times (loop 110). The repetition of the deposition cycle is determined based on the thickness of the material comprising noble metal deposited. For example, if the thickness of the material comprising noble metal is not sufficient for the desired device structure, then the method 100 may return to the process block 104 and the processes of contacting the substrate with the noble metal precursor 104 and contacting the substrate with the reactant 106 may be repeated one or more times (loop 110). Once the material comprising noble metal has been deposited to a desired thickness, the method may be stopped, and the material comprising noble metal and the underlying semiconductor structure may be subjected to additional processes to form one or more device structures.

In some embodiments, the material comprising a noble metal deposited according to methods described herein may be continuous on the first surface at a thickness below approximately 100 nm, or below approximately 60 nm, or below approximately 50 nm, or below approximately 40 nm, or below approximately 30 nm, or below approximately 25 nm, or below approximately 20 nm, or below approximately 15 nm, or below approximately 10 nm, or below approximately 5 nm, or lower. The continuity referred to herein can be physically continuity or electrical continuity. In some embodiments the thickness at which a material may be physically continuous may not be the same as the thickness at which a material is electrically continuous, and the thickness at which a material may be electrically continuous may not be the same as the thickness at which a material is physically continuous.

In some embodiments, a material comprising noble metal deposited according to some of the embodiments described herein may form a layer having a thickness from about 10 nm to about 100 nm. In some embodiments, a material comprising noble metal deposited according to some of the embodiments described herein may form a layer having a thickness from about 1 nm to about 10 nm. In some embodiments, the material comprising noble metal may form a layer having a thickness of less than 10 nm. In some embodiments, a material comprising noble metal deposited according to some of the embodiments described herein may form a layer having a thickness from about 10 nm to about 50 nm. In some embodiments, a noble metal containing material deposited according to some of the embodiments described herein may form a layer having a thickness greater than about 20 nm, or greater than about 40 nm, or greater than about 40 nm, or greater than about 50 nm, or greater than about 60 nm, or greater than about 100 nm, or greater than about 250 nm, or greater than about 500 nm. In some embodiments, a material comprising noble metal deposited according to some of the embodiments described herein may form a layer having a thickness of less than about 50 nm, less than about 30 nm, less than about 20 nm, less than about 15 nm, less than about 10 nm, less than about 5 nm, less than about 3 nm, less than about 2 nm, or even less than about 1 nm.

Figure 2:
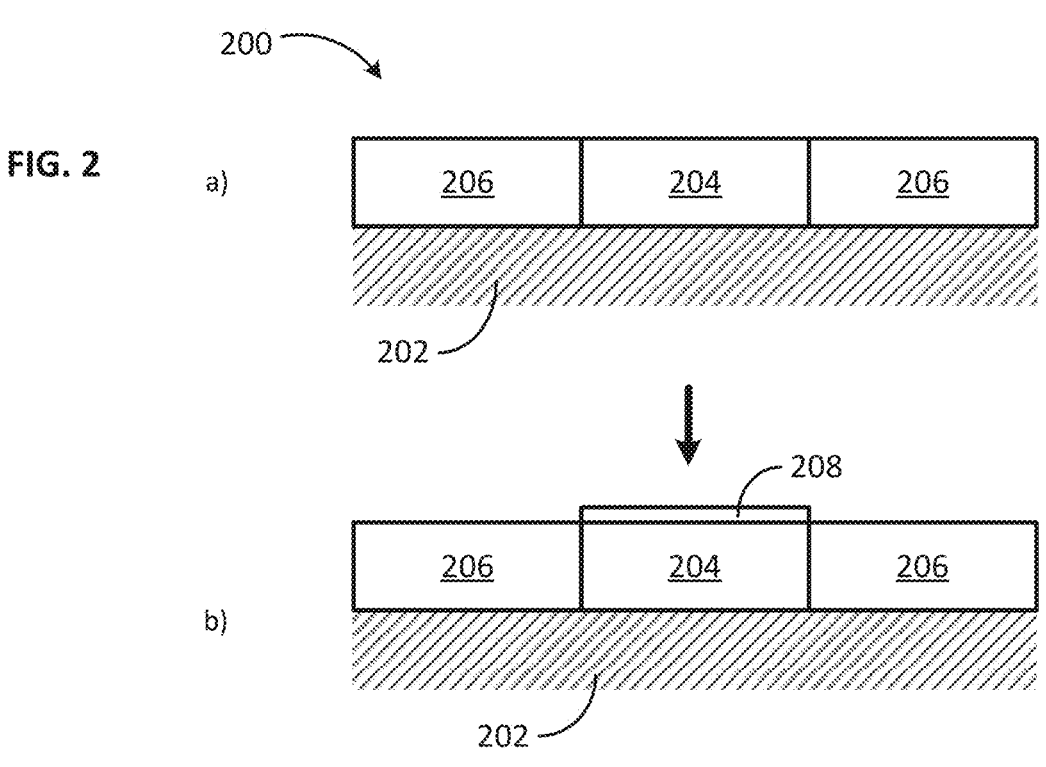
FIG. 2 is a schematic presentation of an exemplary embodiment of a method according to the current disclosure.

FIG. 2 illustrates a partially fabricated semiconductor device structure 200 as a simplified schematic illustration. As depicted in FIG. 2*a*, the structure 200 comprises a substrate 202 and a first surface 204 formed over the substrate 202. The first surface 204 may comprise a silicon-containing material, such as silicon oxide. The structure further comprises a second surface 206 formed in the figure on each side of the first surface 204. In some embodiments, the second surface 206 may comprise one or more of Cu, Co, high k material or native (i.e. non-activated SiOC).

FIG. 2*b* illustrates the partially fabricated semiconductor device after a layer comprising noble metal 208 has been deposited on the first surface.

Figure 4:
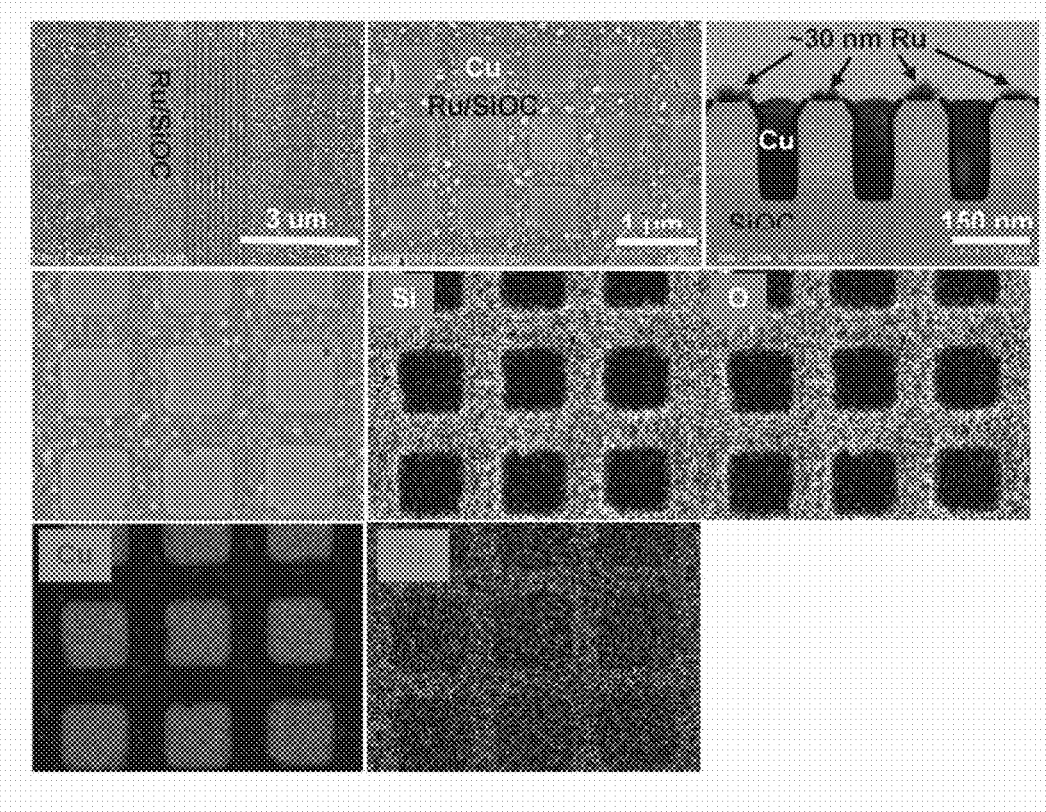
FIG. 4 is an electron micrograph presenting selective deposition of ruthenium.
Figure 5:
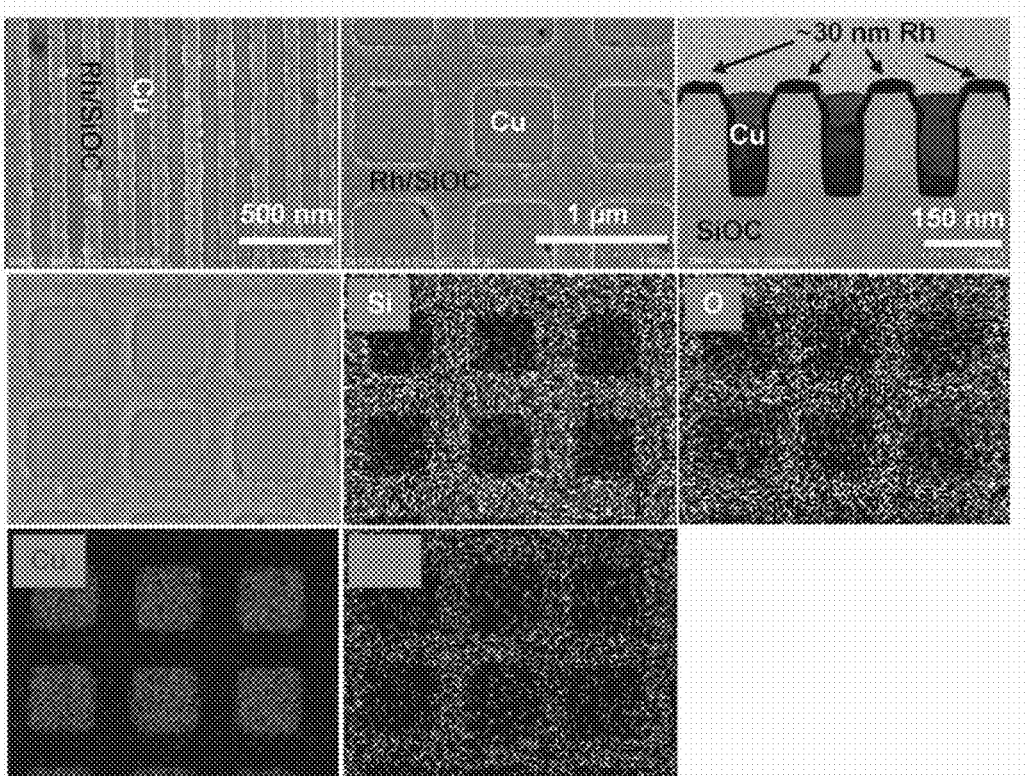
FIG. 5 is an electron micrograph presenting selective deposition of rhodium.
Figure 6:
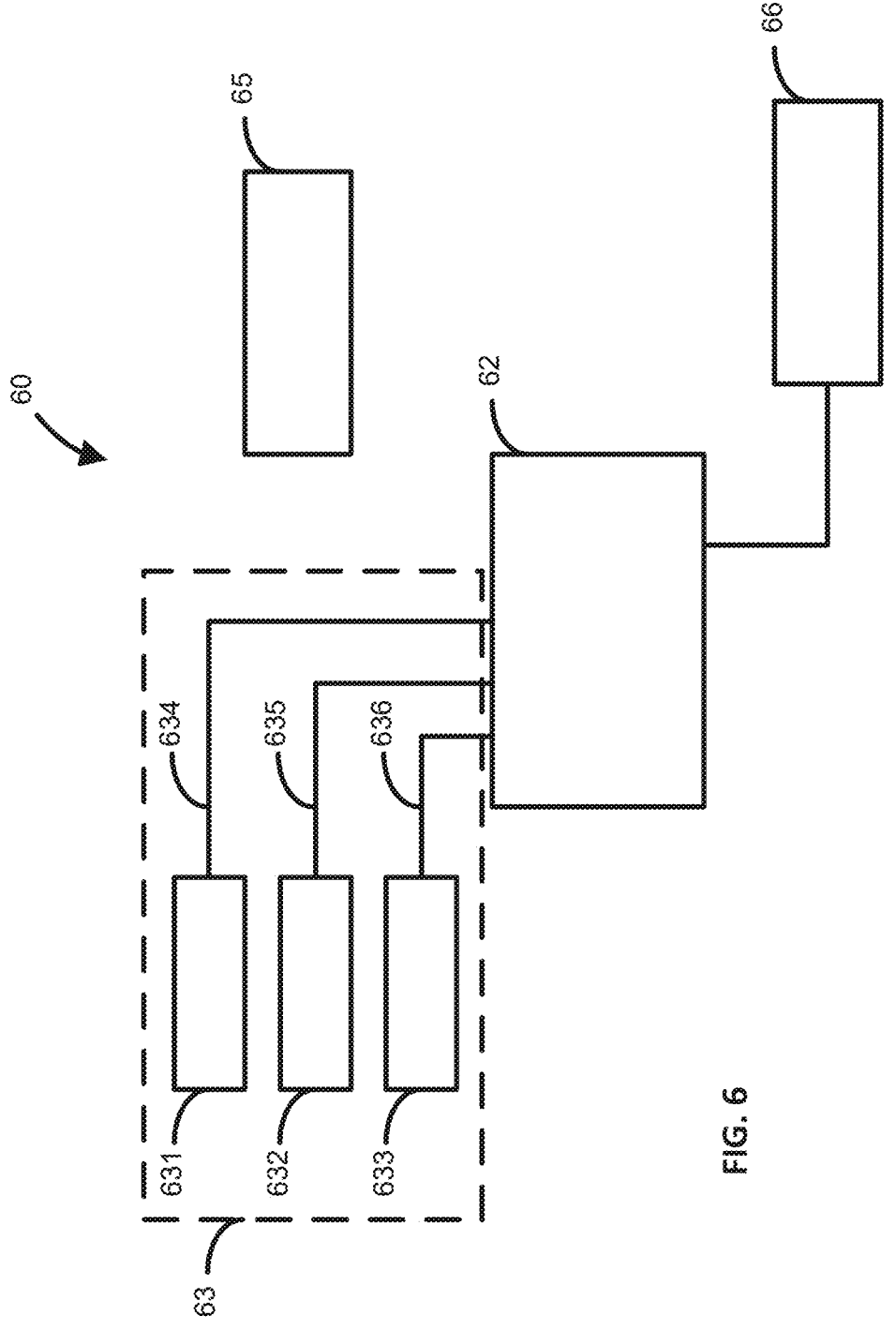
FIG. 6 is a schematic presentation of a vapor deposition assembly according to the current disclosure.

FIGS. 3 to 6 are electron micrographs presenting selective deposition of iridium (FIG. 3), ruthenium (FIG. 4), rhodium (FIG. 5) and palladium (FIG. 6). In the exemplary deposition processes, a reaction chamber at a pressure of about 7.5 Torr was used, $N_2$ was used as a carrier and purge gas, and native $SiO_2$, SiOC, Cu, Co, Ru, $Al_2O_3$, $ZrO_2$, and/or $HfO_2$, were present on the substrates used for depositing material comprising a noble metal. Cu and Co surfaces used in the depositions comprised a native oxide surface.

Figure 3:
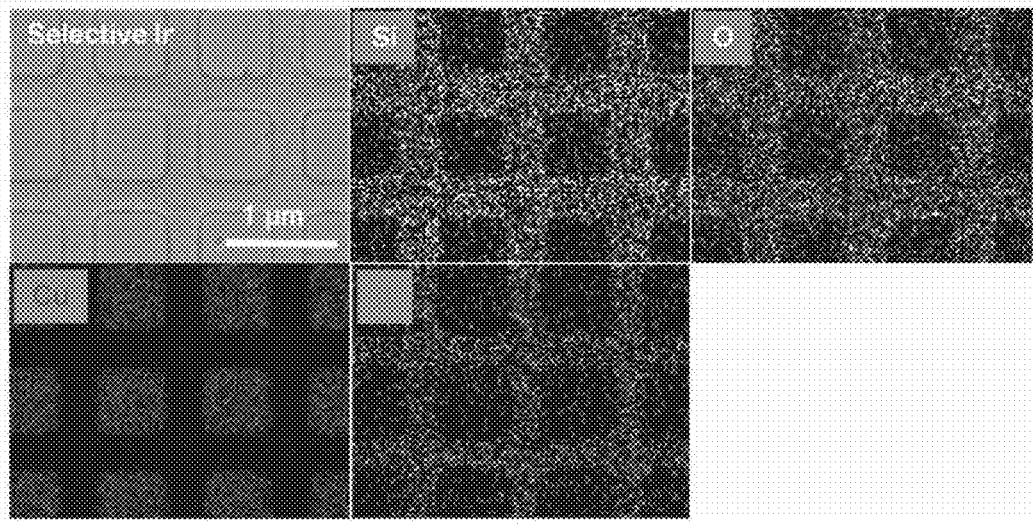
FIG. 3 is an electron micrograph presenting selective deposition of iridium.

In FIG. 3, selective deposition of Ir from $Ir(acac)_3$ and $O_2$ is depicted. The deposition was first performed on three blanket surfaces: native $SiO_2$, low-k SiOC, and native oxide-covered Cu. Ir films were deposited at 250° C. with a cycle number of 1000. SEM and XPS were used to characterize the Ir growth on the different surfaces. A continuous and substantially pinhole-free Ir film was deposited on native $SiO_2$, whereas no visible growth was detected on Cu and SiOC. XPS measurements further confirmed the selectivity of Ir deposition.

FIG. 3 depicts energy dispersive X-ray maps of the Si, O, Cu, and Ir distributions on a sample comprising UV-activated SiOC surfaces as the first surface, and Cu surfaces as the second surface. For this sample, the deposition was performed at a temperature of 225° C. A strong Ir signal on the surfaces coinciding with Si and O signals indicates that Ir was selectively deposited on SiOC. This was confirmed with scanning electron microscopy (SEM) and transmission electron microscopy (TEM).

Ir deposition was further performed on surfaces comprising $Al_2O_3$, $ZrO_2$, $HfO_2$, Co, and Ru at a temperature of 250° C. for 1000 cycles. No Ir growth was observed on Cu, $Al_2O_3$, $ZrO_2$ and $HfO_2$, and this result was confirmed by X-ray photoelectron spectroscopy (XPS). By contrast, Ir was deposited on Ru, which result was again confirmed by XPS.

FIG. 4 depicts energy dispersive X-ray maps presenting selective deposition of ruthenium. Ru was deposited at a temperature of 300° C., using $Ru(thd)_3$ as the noble metal precursor, and a mixture of $O_2$ and $H_2O$ as the reactant. Selective ALD of Ru was performed at a temperature of 300° C. on substrates comprising UV-activated SiOC as the first surface, and Cu as the second surface. Although some Cu etching was observed after the deposition, excellent selective growth of Ru on the UV-activated SiOC regions over the Cu regions was achieved.

Further selectivity tests of ruthenium deposition were performed on native oxide-terminated Si, low-k SiOC, and native oxide-terminated Cu at 300° C. and 350° C. for 1000 cycles. At 300° C., substantial growth was observed on Si while no Ru growth occurred on SiOC and Cu. Therefore, an excellent selectivity was achieved between Si versus low-k SiOC and Cu. Similarly to the above embodiment of Ir deposition, Ru did not grow on $Al_2O_3$, $ZrO_2$, and $HfO_2$, as characterized by SEM. At 350° C., selective growth of Ru on Si was also demonstrated. No visible growth was observed on Cu.

FIG. 5 is an electron micrograph presenting selective deposition of rhodium. Selectivity similar to the Ir and Ru processes was achieved in depositing rhodium with $Rh(acac)_3$ as the noble metal precursor, and $O_2$ as the reactant at 250° C. Native $SiO_2$ and UV-activated SiOC were used as the first surfaces, and native oxide-covered Cu, SiOC, $Al_2O_3$, $ZrO_2$, and $HfO_2$ were used as second surfaces. Excellent selectivity for Rh growth was demonstrated with 1000 deposition cycles at 250° C. On the tested substrate, a Rh layer with a thickness of about 30 nm was selectively deposited on the UV-activated SiOC surface, while no growth was measured on the Cu regions, as characterized with SEM, TEM, and EDS mapping.

FIG. 6 is a schematic presentation of a vapor deposition assembly 60 according to the current disclosure. Deposition assembly 60 can be used to perform a method as described herein and/or to form a structure or a device, or a portion thereof as described herein.

In the illustrated example, deposition assembly 60 includes one or more reaction chambers 62, a precursor injector system 63, a noble metal precursor vessel 631, reactant vessel 632, a purge gas source 633, an exhaust source 64, and a controller 65.

Reaction chamber 62 can include any suitable reaction chamber, such as an ALD or CVD reaction chamber.

The noble metal precursor vessel 631 can include a vessel and one or more noble metal precursors as described herein—alone or mixed with one or more carrier (e.g., inert) gases. Reactant vessel 632 can include a vessel and a reactant according to the current disclosure—alone or mixed with one or more carrier gases. Purge gas source 633 can include one or more inert gases as described herein. Although illustrated with three source vessels 631-633, deposition assembly 60 can include any suitable number of source vessels. Source vessels 631-633 can be coupled to reaction chamber 62 via lines 634-636, which can each include flow controllers, valves, heaters, and the like. In some embodiments, the noble metal precursor in the precursor vessel may be heated. In some embodiments, the vessel is heated so that the noble metal precursor reaches a temperature between about 100° C. and about 225° C., such as between about 120° C. and about 200° C., or between about 120° C. and about 185° C., for example 130° C., 140° C., 160° C., 165° C., or 180° C.

Exhaust source 64 can include one or more vacuum pumps.

Controller 65 includes electronic circuitry and software to selectively operate valves, manifolds, heaters, pumps and other components included in the deposition assembly 60. Such circuitry and components operate to introduce precursors, reactants and purge gases from the respective sources 631-633. Controller 65 can control timing of gas pulse sequences, temperature of the substrate and/or reaction chamber 62, pressure within the reaction chamber 62, and various other operations to provide proper operation of the deposition assembly 60. Controller 65 can include control software to electrically or pneumatically control valves to control flow of precursors, reactants and purge gases into and out of the reaction chamber 62. Controller 65 can include modules such as a software or hardware component, which performs certain tasks. A module may be configured to reside on the addressable storage medium of the control system and be configured to execute one or more processes.

Other configurations of deposition assembly 60 are possible, including different numbers and kinds of precursor sources and purge gas sources. Further, it will be appreciated that there are many arrangements of valves, conduits, precursor sources, and purge gas sources that may be used to accomplish the goal of selectively and in coordinated manner feeding gases into reaction chamber 62. Further, as a schematic representation of a deposition assembly, many components have been omitted for simplicity of illustration, and such components may include, for example, various valves, manifolds, purifiers, heaters, containers, vents, and/ or bypasses.

During operation of deposition assembly 60, substrates, such as semiconductor wafers (not illustrated), are transferred from, e.g., a substrate handling system to reaction chamber 62. Once substrate(s) are transferred to reaction chamber 62, one or more gases from gas sources 631-633, such as precursors, reactants, carrier gases, and/or purge gases, are introduced into reaction chamber 62 to effect a method according to the current disclosure.

The example embodiments of the disclosure described above do not limit the scope of the invention, since these embodiments are merely examples of the embodiments of the invention, which is defined by the appended claims and their legal equivalents. Any equivalent embodiments are intended to be within the scope of this invention. Various modifications of the disclosure, in addition to those shown and described herein, such as alternative useful combinations of the elements described, may become apparent to those skilled in the art from the description. Such modifications and embodiments are also intended to fall within the scope of the appended claims.

The invention claimed is:

1. A method of selectively depositing material comprising noble metal on a substrate by a cyclic deposition process, the method comprising:
   providing a substrate in a reaction chamber, wherein the substrate comprises a first surface comprising a first material, and a second surface comprising a second material, and wherein the first surface and the second surface comprise different materials;
   providing a noble metal precursor comprising a noble metal β-diketonate compound in the reaction chamber in vapor phase; and
   providing a reactant in the reaction chamber in vapor phase to deposit a material comprising noble metal on the first surface, wherein the first surface comprises silicon or silicon and oxygen,
   wherein the material comprising a noble metal is not deposited on the second surface or is deposited to a lesser extent on the second surface relative to the first surface, and
   wherein the second surface comprises a metal.

2. The method of claim 1, wherein a β-diketonate ligand of the noble metal β-diketonate compound is selected from the group consisting of acetylacetonato (pentane-2,4-dionate) (acac), hexafluoroacetylacetonato (1,1,1,5,5,5-hexanfluoropentane-2,4-dionato) (hfac), 2,2,6,6-tetramethylheptane-3,5-dionato (thd), 2,2-dimethyl-6,6,7,7,8,8,8-heptafluorooctane-3,5-dionato (fod).

3. The method of claim 1, wherein the noble metal of the noble metal β-diketonate compound comprises a member selected from the group consisting of Ru, Rh, Pd, Ag, Ir, Pt, and Au.

4. The method of claim 1, wherein the reactant comprises an oxygen reactant.

5. The method of claim 1, wherein the reactant comprises molecular hydrogen ($H_2$).

6. The method of claim 1, wherein the noble metal is deposited substantially as elemental noble metal.

7. The method of claim 1, wherein a substantially continuous noble metal layer having a thickness of at least 10 nm is deposited on the first surface with substantially no deposition on the second surface.

8. The method of claim 1, wherein the noble metal precursor and the reactant are provided in the reaction chamber alternately and sequentially.

9. The method of claim 1, wherein the method further comprises activating the substrate before providing the noble metal precursor in the reaction chamber.

10. The method of claim 9, wherein the activating the substrate comprises exposing the substrate to UV radiation.

11. The method of claim 1, wherein the material comprising noble metal is deposited at temperature from about 200° C. to about 375° C.

12. The method of claim 1, wherein the metal of the second surface comprises an elemental metal.

\* \* \* \* \*